United States Patent [19]

Kobayashi et al.

[11] Patent Number: 4,868,775
[45] Date of Patent: Sep. 19, 1989

[54] ADAPTIVE DIGITAL FILTER

[75] Inventors: Masaki Kobayashi; Yoshio Itoh, both of Tokyo, Japan

[73] Assignee: Oki Electric Industry Co., Ltd., Tokyo, Japan

[21] Appl. No.: 70,773

[22] Filed: Jul. 7, 1987

[30] Foreign Application Priority Data

Jul. 14, 1986 [JP] Japan ................................ 61-163677
Jul. 15, 1986 [JP] Japan ................................ 61-164770

[51] Int. Cl.⁴ ...................... G06F 15/31; G06F 15/20; G06G 7/48
[52] U.S. Cl. ................................ 364/724.19; 364/553
[58] Field of Search ................... 364/553, 724, 724.19, 364/724.2; 379/410; 333/18, 28 R, 28 T; 375/11-16; 370/32.1

[56] References Cited

U.S. PATENT DOCUMENTS

| | | | |
|---|---|---|---|
| 4,359,778 | 11/1982 | Lee | 364/724 |
| 4,520,491 | 5/1985 | Raulin et al. | 364/724 |
| 4,606,045 | 8/1986 | Miller | 364/724 |
| 4,660,163 | 4/1987 | Fukasawa | 364/724 |
| 4,811,261 | 3/1989 | Kobayashi et al. | 364/724.19 |

FOREIGN PATENT DOCUMENTS

| | | | |
|---|---|---|---|
| 159546 | 10/1985 | European Pat. Off. | 375/11 |
| 206223 | 12/1983 | Japan | |
| 141814 | 8/1984 | Japan | |
| 61-200713 | 9/1986 | Japan | 364/724 |
| 61-258522 | 11/1986 | Japan | 364/724 |
| 62-112413 | 5/1987 | Japan | 364/724 |

OTHER PUBLICATIONS

"Computer Aided Design and Analysis of Standard IIR Architectures—Part II" IEEE Circuits and Systems Magazine, vol. 4, No. 1, Mar. 1982, pp. 4–10.

1985 Symposium on Information Systems of the Institute of Electronics and Communication Engineers of Japan, "A Synthesis Method of Adaptive Digital Filters" Itoh et al., No. 366, pp. 2–107.

Measurement and Control, vol. 7, No. 9, Sep. 1978, "A Learning Method for System Identification" Noda et al., pp. 597–605.

Primary Examiner—Gary V. Harkcom
Assistant Examiner—Dale M. Shaw
Attorney, Agent, or Firm—Spencer & Frank

[57] ABSTRACT

In an adaptive digital filter, the inputs to the variable-coefficient scalers of an adaptive digital filter are mutually orthogonal and their mean square values are equal. As a result, the rate of convergence of the variable coefficients of the variable-coefficient scalers is rapid. The adaptive filter is suitable for use in echo cancelers.

6 Claims, 7 Drawing Sheets

FIG.5B

ADAPTIVE DIGITAL FILTER

BACKGROUND OF THE INVENTION

This invention relates to an adaptive digital filter capable of generating an arbitrary transfer function. In particular, it relates to an adaptive digital filter having a fast rate of convergence, suitable for use in a device such as an echo canceler.

Recent rapid progress in digital signal-processing technology has created great interest in adaptive digital filters due to their wide range of applications. Typical of these applications is system identification, which is a process of estimating an unknown system characteristic from input and output data.

Figure 1:
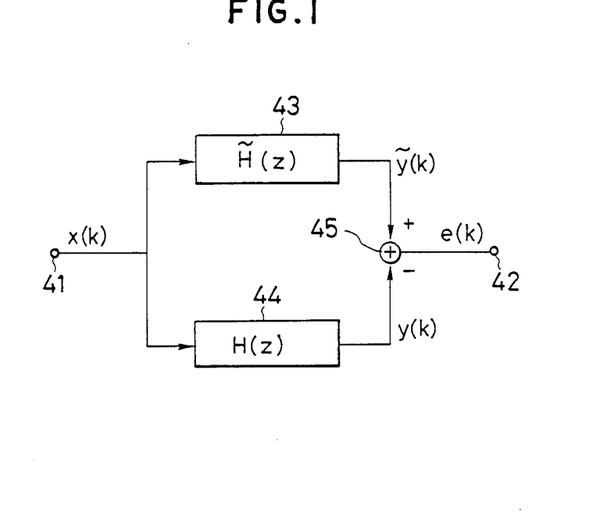
FIG. 1 is a block diagram showing an arrangement for identifying an unknown system.

Means for the identification of an unknown system by use of an adaptive digital filter are shown in schematic form in FIG. 1. These means comprise a signal input terminal 41, an error output terminal 42, an unknown system 43, an adaptive digital filter (ADF) 44, and an adder 45. In the figure, x(k) is the input to the unknown system 43 and the adaptive digital filter 44 at time k, $\bar{y}$(k) is the output from the unknown system 43 at time k, y(k) is the output from the adaptive digital filter 44 at time k, e(k) is the estimation error at time k, H(z) is the transfer function of the unknown system, and $\bar{H}$(z) is the transfer function of the adaptive digital filter 44. In the configuration shown, if the evaluation function is $J=e(k)^2$, then when J=O the adaptive digital filter 44 is regarded as correctly estimating the characteristic of the unknown system 43.

Figure 2:
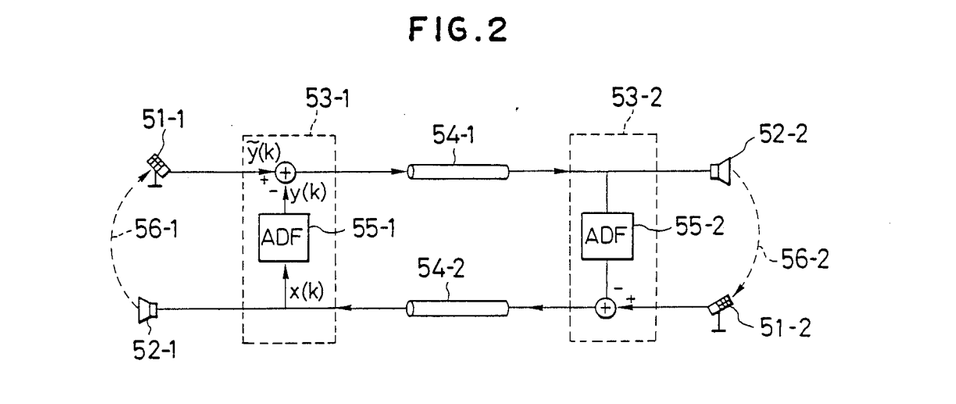
FIG. 2 is a schematic diagram showing a teleconference system using an ADF for echo canceler cancelling the echos due to acoustic coupling between the loudspeaker and the microphone.

A specific type of device using an adaptive digital filter like the one described above is an echo canceler. Echo cancelers are used, for example, in teleconferencing systems, for which there has been a recently growing demand. FIG. 2 is a schematic diagram of a teleconferencing system employing an echo canceler. This system comprises a pair of microphones 51-1 and 51-2, a pair of loudspeakers 52-1 and 52-2, a pair of echo cancelers 53-1 and 53-2 having respective adaptive digital filters 55-1 and 55-2, and a pair of transmission lines 54-1 and 54-2, and 55-2, and has a pair of acoustically coupled paths 56-1 and 56-2. In most teleconferencing systems the loudspeaker and microphone shown in FIG. 2 are integrated into a single unit called a voice terminal. This gives rise to an acoustic coupling between the loudspeaker and the microphone: the signal output from the loudspeaker is coupled into the microphone and greatly degrades the quality of the voice transmission. In FIG. 2 there are acoustic coupling paths, labeled 56-1 and 56-2, between the loudspeaker 52-1 and the microphone 51-1, and between the loudspeaker 52-2 and the microphone 51-2, but the echo cancelers 53-1 and 53-2 act to reduce the signal coupled from the loudspeaker into the microphone.

Figure 3:
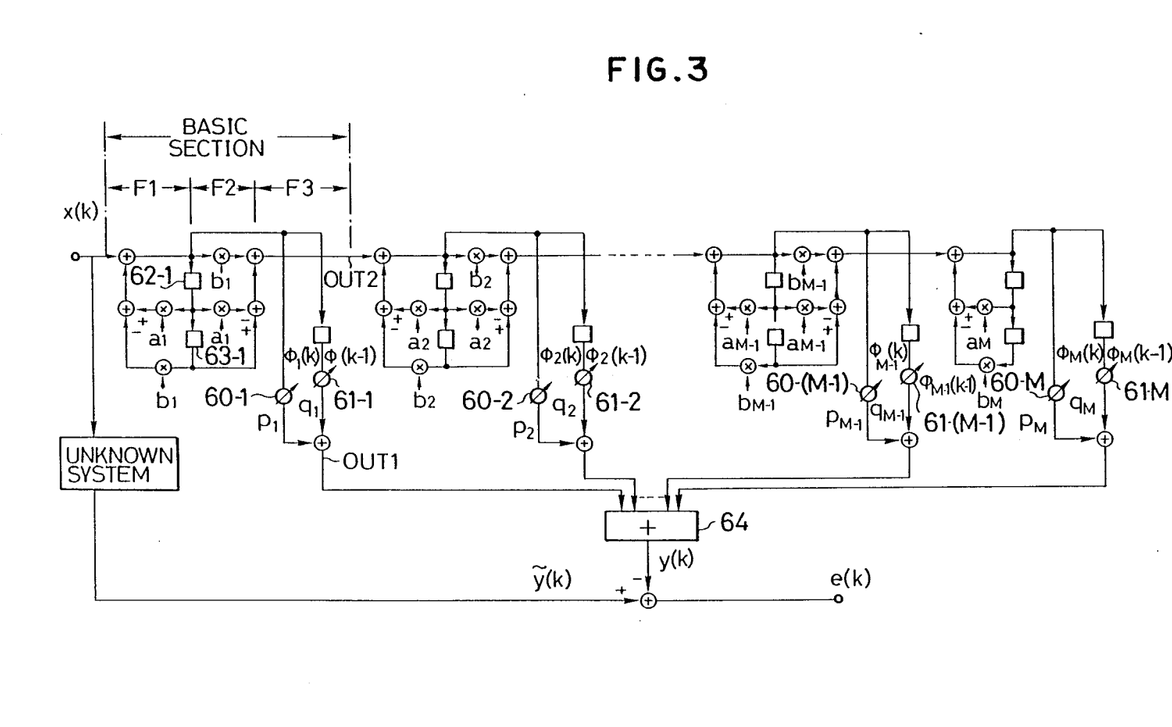
FIG. 3 is a block diagram showing a conventional ADF.

FIG. 3 shows the type of adaptive digital filter used in such an echo canceler in the prior art. (See the Proceedings of the 1985 Symposium on Information Systems of the Institute of Electronics and Communication Engineers of Japan, No. 366, pp. 2-107.) The adaptive digital filter in FIG. 3 comprises M basic sections, where M is a positive integer. Each basic section except the M-th comprises a second-order recursive digital filter F1 (having unit delay elements 62-1 and 63-1), a second-order non-recursive digital filter F2, and a first-order non-recursive digital filter F3. The zeros of the second-order non-recursive digital filter F2 are mirror images of the poles of the second-order recursive digital filter with respect to the unit circle. The M-th basic section comprises a second-order recursive digital filter and a first-order non-recursive digital filter. The first outputs (OUT1) of the M basic sections are connected to the inputs of an adder 64, the output of which is the output of the adaptive digital filter. The second outputs (OUT2) of the first through M-1-th basic sections are connected to the inputs of the next higher basic section. The input of the first basic section is the input to the adaptive digital filter.

In an adaptive digital filter configured as above, let $\phi_1(k)$, $\phi_1(k-1)$, $\phi_2(k)$, $\phi_2(k-1)$, ..., $\phi_M(k)$, $\phi_M(k-1)$, be the input signals to the variable-coefficient scalers 60-1, 61-1, 60-2, 61-2, ..., 60-M, 61-M, the variable coefficients of which are $p_1$, $q_1$, $p_2$, $q_2$ ..., $p_M$, $q_M$. Then the following relationships hold:

$$\overline{\phi_i(k)\phi_l(k)} = \overline{\phi_i(k-1)\phi_l(k)} = \overline{\phi_i(k)\phi_l(k-1)} \quad (1)$$
$$= \overline{\phi_i(k-1)\phi_l(k-1)} = 0$$

Where i=1, 2, ..., M; l=1, 2, ..., M; and i≠l. The overbar denotes the result of an averaging operation at time k. The above equations indicate that the inputs to the variable-coefficient scalers of ADF-i and ADF-l are orthogonal.

In an adaptive digital filter employing the prior art as shown in FIG. 3, however, the average value of the product of the input signal $\phi_i(k)$ of the variable-coefficient scaler 60-i and the input signal $\phi_i(k-1)$ of the variable-coefficient scaler 61-i in the i-th basic section is not 0:

$$\overline{\phi_i(k)\phi_i(k-1)} \neq 0 (i=1, 2, ..., M) \quad (2)$$

Also, the mean square values $\overline{\phi_1^2(k)}$, $\overline{\phi_2^2(k)}$, ..., $\overline{\phi_M^2(k)}$ of the input signals $\phi_1(k)$, $\phi_2(k)$, ..., $\phi_M(k)$ are not equals:

$$\overline{\phi_i^2(k)} = \overline{\phi_l^2(k)} (i \neq l) \quad (3)$$

As a result, the convergence rate of the variable coefficients $p_1$, $q_1$, $p_2$, $q_2$, ..., $p_M$, $q_M$ is slow.

SUMMARY OF THE INVENTION

An object of this invention is to solve the above problem in the prior art and provide an adaptive digital filter in which the variable coefficient of the variable-coefficient scalers converge quickly.

This invention applies to an adaptive digital filter comprising M basic sections (where M is a positive integer) connected in series, in which the first M-1 basic sections include an input terminal, a first output terminal, and a second output terminal, the M-th basic section includes an input terminal and a first output terminal, the input terminal of the first basic section is the signal input terminal of the adaptive digital filter as a whole, the input terminal of each of the other basic sections is connected to the second output terminal of the immediately preceding basic section, and the output of the adaptive digital filter as a whole is the sum of the signals output from the first output terminals of each of the basic sections. In such an adaptive digital filter, this invention provides that:

(a) In each of the M basic sections, the path from the input terminal to the first output terminal comprises three circuits connected in series: a first scaler; a second-order recursive digital filter; and a first-order nonrecursive digital filter, the input of which is connected to the 0th-order circuit in the second-order recursive digital filter.

(b) In each of the first through the M-1-th basic sections, the path from the input terminal to the second output terminal comprises three circuits connected in series: the above first scaler; the above second-order recursive digital filter; and a second-order nonrecursive digital filter.

(c) In the m-th basic section ($1 \leq m \leq M$), the first-order nonrecursive digital filter comprises a second scaler for multiplying the input signal $u_m(k)$ by a coefficient $R_m$, a first adder for adding the output of the second scaler to the signal $u_m(k-1)$ delayed by one unit of time, a third scaler for multiplying the output of the first adder by a coefficient $S_m$, a first variable-coefficient scaler for multiplying the output $\hat{u}_m(k)$ of the third scaler by a variable coefficient $d_m(k)$ to form a product $d_m(k)\hat{u}_m(k)$, a second variable-coefficient scaler for multiplying the signal $u_m(k)$ by a variable coefficient $c_m(k)$ to form product $c_m(k)u_m(k)$, and a second adder for adding these two products.

In an alternative arrangement, the first-order nonrecursive digital filter of the m-th basic section ($1 \leq m \leq M$) comprises a second scaler for multiplying the one-unit time delayed signal $u_m(k-1)$ by a coefficient $R_m$, a first adder for adding the output of the second scaler to the input signal $u_m(k)$, a third scaler for multiplying the output of the first adder by a coefficient $S_m$, a second variable-coefficient scaler for multiplying the output $\hat{u}_m(k)$ of the third scaler by a variable coefficient $c'_m(k)$ to form a product $c'_m(k)u_m(k)$, a first variable-coefficient scaler for multiplying the signal $u_m(k-1)$ by a variable coefficient $d'_m(k)$ to form product $d'_m(k)u_m(k-1)$, and a second adder for adding these two products.

(d) The coefficient $Q_m$ of the first scaler is selected so that the mean square value of the signal at the point at which the second-order recursive digital filter and the second-order nonrecursive digital filter are connected in series is equal to the mean square value of the signals at the corresponding series connection points in the other basic sections.

(e) The coefficient $R_m$ of the second scaler is selected so that the signals $u_m(k)$ and $\hat{u}_m(k)$ are orthogonal.

(f) The coefficient $S_m$ of the third scaler is selected so that the mean square value of the signal $u_m(k)$ and the mean square value of the signal $\hat{u}_m(k)$ are equal.

The input signal $p_1(k)$ is fed to the input terminal of the first basic section passes through the first scaler, the second-order recursive digital filter, and the second-order nonrecursive digital filter to the second output terminal. The output signal $p_2(k)$ from this second output terminal is fed to the input terminal of the second basic section, which acts on it in the same way as in the first basic section and outputs the result at the second output terminal. This process continues through the M-1-th section. The signal $p_M(k)$ that is output from the second output terminal of the M-1-th basic section is fed to input terminal of the M-th basic section.

The input signal $p_1(k)$ fed to the input terminal of the first basic section also passes through the first scaler, the second-order recursive digital filter, and the first-order nonrecursive digital filter to the first output terminal, generating the output signal $y_1(k)$. Similarly, the input signal $p_2(k)$ fed to the input terminal of the second basic section generates an output signal $y_2(k)$ at the first output terminal of that section. Signals $y_3(k), \ldots, y_M(k)$ are generated in the same way at the first output terminals of the other basic sections through the M-th. The signals $y_1(k), y_2(k), \ldots, y_M(k)$ are added to create the output of the digital filter.

Owing to the provision of the first through third scalers in this invention and the selection of their coefficients $Q_m$, $R_m$, and $S_m$ as set forth above:

1. The mean square value of the signal at the point at which the second-order recursive digital filter and second-order nonrecursive digital filter are connected in series is equal to the mean square values of the signals at the corresponding series connection points in the other sections;

2. In each section, the inputs to the first and second variable-coefficient scalers are orthogonal; and 3. The mean square values of these inputs are equal.

The problems described earlier are therefore solved.

DETAILED DESCRIPTION OF THE EMBODIMENTS

An embodiment of this invention will next be described with reference to the drawings.

Figure 4A:
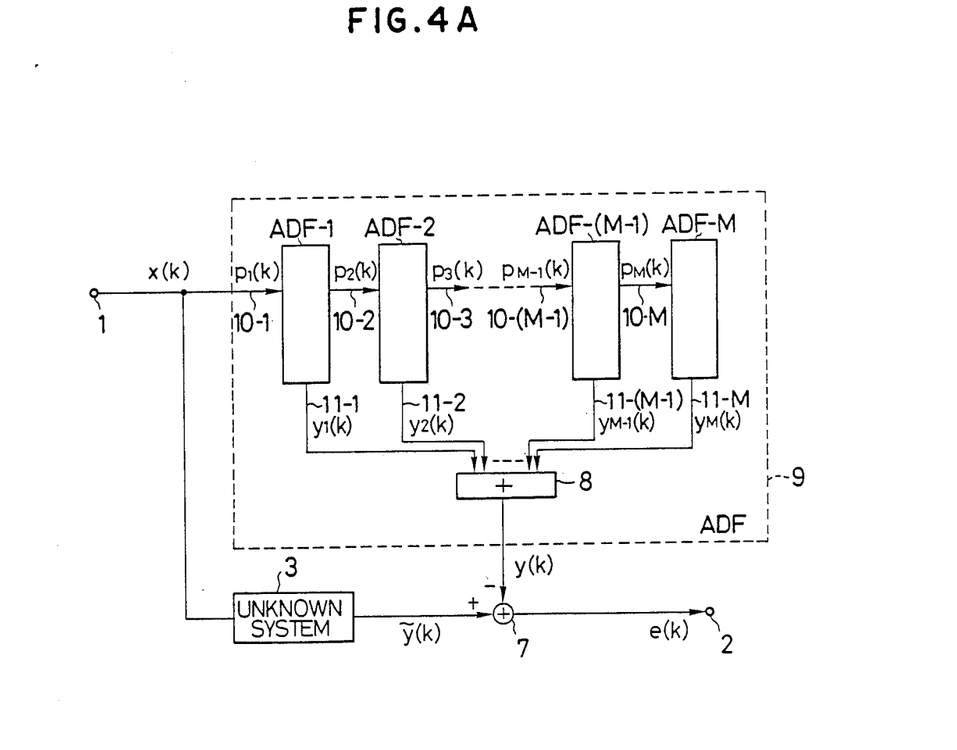
FIG. 4A is a block diagram showing the general construction of a first embodiment of the invention.
Figure 4B:
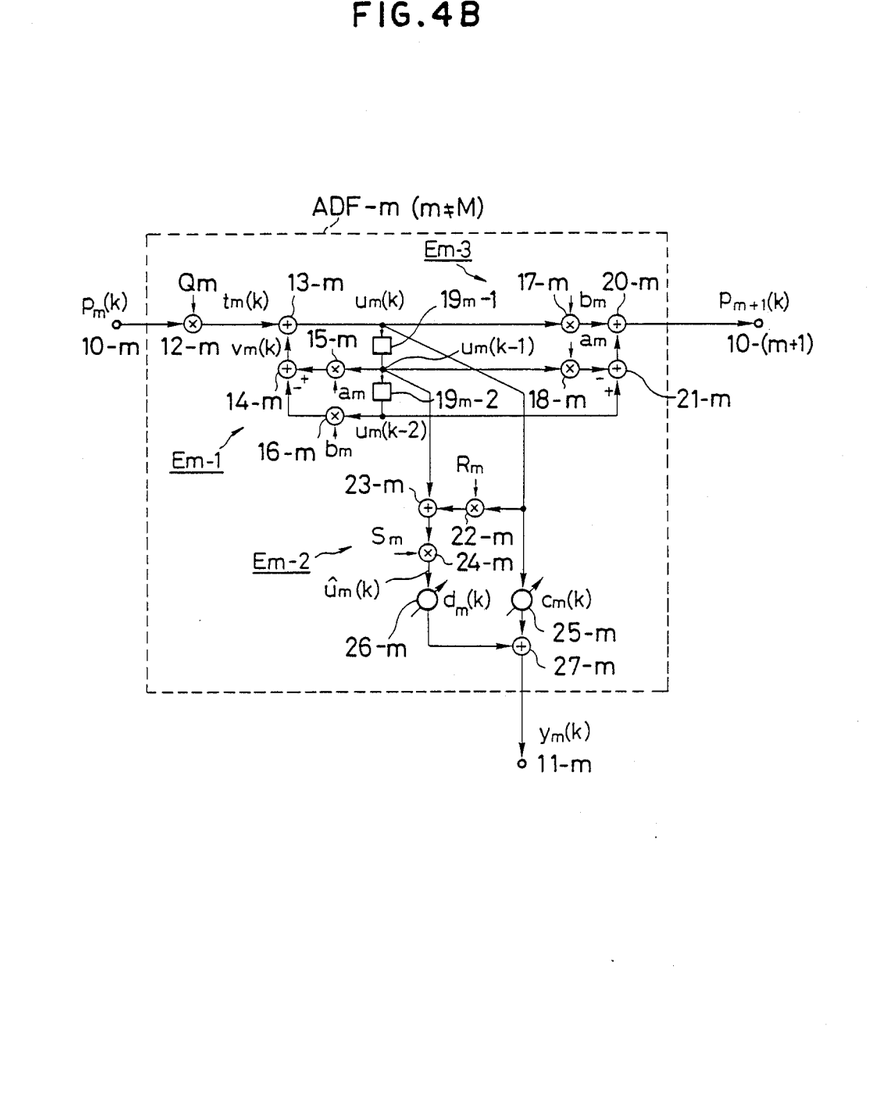
FIG. 4B is a block diagram showing the construction of ADF-m (m=M) in FIG. 4A.
Figure 4C:
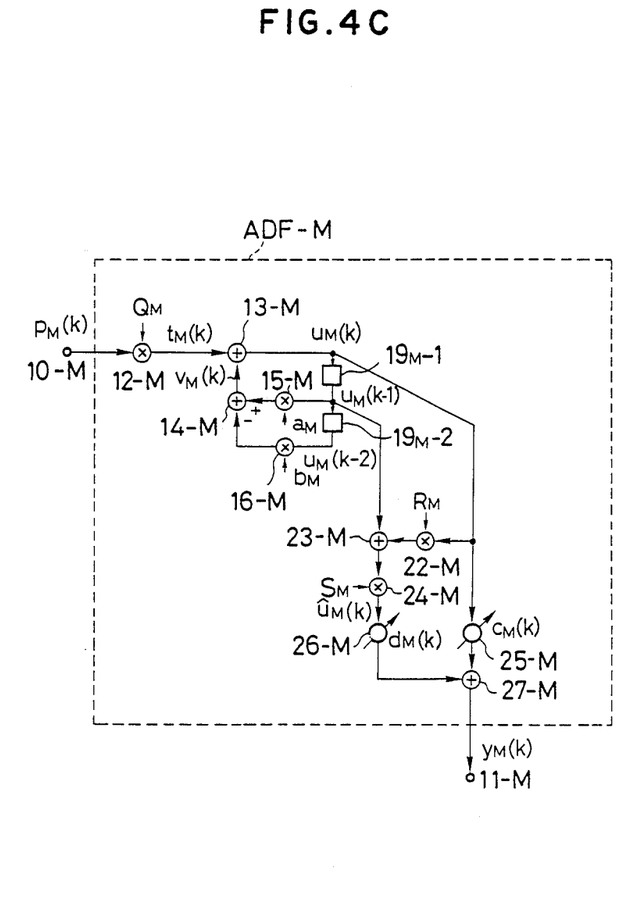
FIG. 4C is a block diagram showing the construction of ADF-M in FIG. 4A.

FIGS. 4A through 4C show the circuit configuration of an embodiment of this invention. FIG. 4A is a block diagram showing the basic configuration of the embodiment. FIG. 4B is a schematic diagram of the circuit of ADF-m (m≠M) in FIG. 4A. FIG. 4C is a schematic diagram of the circuit of ADF-M in FIG. 4A.

First the basic configuration of this embodiment will be explained with reference to FIG. 4A. The adaptive digital filter comprises the blocks within the dashed line 9. The blocks ADF-1, ADF-2, . . . , ADF-(M-1), ADF-M of the adaptive digital filter 9 are connected in series. At time k, ADF-1 receives at its input terminal 10-1 the signal $p_1(k)$ (which is the same as x(k), the input signal of the adaptive digital filter 9 at the input terminal 1 of this embodiment). The signal $p_2(k)$ is sent at the same time k to the input terminal 10-2 of ADF-2 (which is an output terminal from the point of view of ADF-1, and will be referred to below as its second output terminal). Simultaneously, the signal $y_1(k)$ is sent to the first output terminal 11-1. At time k, ADF-2 receives the signal $p_2(k)$ at its input terminal 10-2, sends the signal $p_3(k)$ to the input terminal 10-3 of ADF-3, and simultaneously sends the signal $y_2(k)$ to its first output terminal 11-2. This process is repeated from ADF-3 through ADF-(M-1). The final section (ADF-M) receives at its input terminal 10-M at time k the signal $p_M(k)$ sent from the second output terminal (10-M) of ADF-(M-1), and simultaneously sends the signal $y_M(k)$ to its first output terminal 11-M. ADF-M does not have a second output terminal. The adder 8 adds the signals $y_1(k)$, $y_2(k)$, ... , $y_{M-1}(k)$, $y_M(k)$ from the first output terminals 11-1, 11-2, ..., 11-(M-1), 11-M, of the sections ADF-1, ADF-2, ..., ADF-(M-1), ADF-M to generate the signal $y(k)$, which is the output of the adaptive digital filter 9 at time k.

The adder 7 subtracts this output $y(k)$ from the output $\bar{y}(k)$ of the unknown system 3, generating the signal $e(k)$ at the output terminal 2.

Next the configuration of ADF-m ($m \neq M$) will be described with reference to FIG. 4B. ADF-m ($m \neq M$) comprises a first scaler 12-m, a second-order recursive digital filter $E_m$-1, a second-order nonrecursive digital filter $E_m$-3, and a first-order nonrecursive digital filter $E_m$-2. The zeros of the second-order nonrecursive digital filter $E_m$-3 and the poles of the second-order recursive digital filter $E_m$-1 are mirror-images of each other in relation to their location. The second-order recursive digital filter $E_m$-1 comprises a pair of adders 13-m and 14-m, a pair of scalers 15-m and 16-m, and a pair of unit delay elements 19m-1 and 19m-2. The second-order nonrecursive digital filter $E_m$-3 comprises the pair of unit delay elements 19m-1 and 19m-2, a pair of scalers 17-m and 18-m, and a pair of adders 20-m and 21-m. The first-order nonrecursive digital filter $E_m$-2 comprises the unit delay element 19m-1, a pair of adders 23-m and 27-m, a second scaler 22-m, a third scaler 24-m, a first variable-coefficient scaler 26-m, and a second variable-coefficient scaler 25-m. The input of the first-order nonrecursive digital filter $E_m$-2 is connected to the 0th-order circuit in the second-order recursive digital filter $E_m$-1 as shown in the drawing.

The elements of this circuit configuration are connected as follows. On the path from the input terminal 10-m to the first output terminal 11-m, the first scaler 12-m, the second-order recursive digital filter $E_m$-1, and the first-order nonrecursive digital filter $E_m$-2 are connected in series. On the path from the input terminal 10-m to the second output terminal 10-(m+1), the first scaler 12-m, the second-order recursive digital filter $E_m$-1, and the second-order nonrecursive digital filter $E_m$-3 are connected in series.

Next the configuration of ADF-M will be described with reference to FIG. 4C. ADF-M comprises a first scaler 12-M, a second-order recursive digital filter $E_M$-1, and a first-order nonrecursive digital filter $E_M$-2. The second-order recursive digital filter $E_M$-2 comprises a pair of adders 13-M and 14-M, a pair of scalers 15-M and 16-M, and a pair of unit delay elements 19M-1 and 19M-2. The first-order nonrecursive digital filter $E_M$-3 comprises the unit delay element 19M-1, a pair of adders 23-M and 27-M, a second scaler 22-M, a third scaler 24-M, a first variable-coefficient scaler 26-M, and a second variable-coefficient scaler 25-M. The input of the first-order nonrecursive digital filter $E_M$-2 is connected to the 0th-order circuit in the second-order recursive digital filter $E_M$-1 as shown in the drawing. The first scaler 12-M, the second-order recursive digital filter $E_M$-1, and the first-order nonrecursive digital filter $E_M$-2 are connected in series on the path from the input terminal 10-M of ADF-M to its first output terminal 11-M as the drawing indicates.

Next the operation of this embodiment will be described.

The circuit ADF-m ($m \neq M$) in FIG. 4B operates as follows. At time k the input terminal 10-m receives the signal $p_m(k)$ sent from ADF-(m-1). (The signal $p_1(k)$ received at the input terminal 10-1 of ADF-1 is the signal $x(k)$ fed to the input terminal 1.) The input signal $p_m(k)$ at time k is multiplied by the coefficient $Q_m$ in the scaler 12-m to create the signal $t_m[=Q_m p_m(k)]$. Also at time k, the signal $u_m(k-1)$ is multiplied by $a_m$ in the scaler 15-m to create the signal $a_m u_m(k-1)$, the signal $u_m(k-2)$ is multiplied by $b_m$ in the scaler 16-m to create the signal $b_m u_m(k-2)$, this signal inverted to create the signal $-b_m u_m(k-2)$, and the result is added to $a_m u_m(k)$ in the adder 14-m to obtain the signal $v_m(k)$. The signals $v_m(k)$ and $t_m(k)$ at time k are added to obtain the signal $u_m(k)$, which is fed to the unit delay element 19m-1 and shifted in the time domain by passage through the unit delay elements 19m-1 and 19m-2. The adder 23-m adds the signal $u_m(k-1)$ which is input to the unit delay element 19m-2 at time k and the signal $R_m u_m(k)$ obtained by multiplying the signal $u_m(k)$ input to the unit delay element 19m-1 at time k by $R_m$, and the scaler 24-m multiplies the result by $S_m$ to create the signal $\hat{u}_m(k)$. This signal is multiplied by $d_m(k)$ in the variable-coefficient scaler 26-m, then added in the adder 27-m to the product of the signal $u_m(k)$ and the variable coefficient $c_m(k)$ to create the signal $y_m(k)$, which is sent to the output terminal 11-m. Also at time k, the signal $u_m(k-1)$ is multiplied by $a_m$ in the scaler 18-m and the product $a_m u_m(k-1)$ is inverted and added to the signal $u_m(k-2)$ in the adder 21-m. The result is added in the adder 20-m to the product of the signal $u_m(k)$ and $b_m$ generated by the scaler 17-m, and the result $p_{m+1}(k)$ is fed to the input terminal 10-(m+1) of ADF-(m+1).

The circuit ADF-M in FIG. 4C operates as follows. At time k the input terminal 10-M receives the signal $p_M(k)$ sent from ADF-(M-1). The input signal $p_M(k)$ at time k is multiplied by the coefficient $Q_M$ in the scaler 12-M to create the signal $t_M[=Q_M p_M(k)]$. Also at time k, the signal $u_M(k-1)$ is multiplied by $a_M$ in the scaler 15-M to create the signal $a_M u_M(k-1)$, the signal $u_M(k-2)$ is multiplied by $b_M$ in the scaler 16-M to create the signal $b_M u_M(k-2)$, this signal is inverted to create the signal $-b_M u_M(k-2)$, and the result and $a_M u_M(k)$ are added in the adder 14-M to obtain the signal $v_M(k)$. The signals $v_M(k)$ and $t_M(k)$ at time k are added to obtain the signal $u_M(k)$, which is fed to the unit delay element 19M-1 and shifted in the time domain by passage through the unit delay elements 19M-1 and 19M-2. The adder 23-M adds the signal $u_M(k-1)$ which is input to the unit delay element 19M-2 at time k and the signal $R_M u_M(k)$ obtained by multiplying the signal $u_M(k)$ input to the unit delay element 19M-1 at time k by $R_M$, and the scaler 24-M multiplies the result by $S_M$ to create the signal $\hat{u}_M(k)$. This signal is multiplied by $d_M(k)$ in the variable-coefficient scaler 26-M, then added in the adder 27-M to the product of the signal $u_M(k)$ and the variable coefficient $c_M(k)$ generated by the variable-coefficient scaler 25-M to create the signal $y_M(k)$, which is sent to the output terminal 11-M.

In the above-described embodiment, the inputs to the variable-coefficient scalers 25-m, 26-m are made to be mutually orthogonal and the mean square values of the input signals are made to be equal, so that the rate of convergence is high. This will be explained in further detail.

In the prior art, the inputs to the variable-coefficient scalers in ADF-i and ADF-l (where $i \neq l$) are mutually orthogonal as shown in Eq. (1), but the inputs to the variable-coefficient scalers in the same ADF-i (i=1, 2, ..., M) are not orthogonal, as shown in Eq. (2). In addition, the mean square values of the signals $\phi_i(k)$ in ADF=i (i=1, 2, ..., M) are unequal, as shown in Eq. (3).

In this embodiment, in contrast, if the coefficients $Q_m$, $R_m$, and $S_m$ of the variable-coefficient scalers 12-m, 22-m, and 24-m are selected as described below, the signals input to the variable-coefficient scalers 25-m and 26-m are mutually orthogonal, and their mean square values are equal.

[Criteria for $Q_m$]

The coefficients $Q_m$ are to be selected so that:

$$Q_1 = \sqrt{\frac{(1-b_1)\{(b_1+1)^2 - a_1^2\}}{1+b_1}} \quad (4)$$

$$Q_m = \sqrt{\frac{(1-b_m)\{(b_m+1)^2 - a_m^2\}}{1+b_m}} \cdot \frac{1}{Q_{m-1}} \quad (5)$$

(where m=2, 3, ..., M) It can then easily be verified that:

$$\overline{x^2(k)} = \overline{u_1^2(k)} = \overline{u_2^2(k)} = \ldots = \overline{u_M^2(k)} \quad (6)$$

[Criteria for $R_m$ and $S_m$]

$R_m$ (m=1, 2, ..., M) is to be selected so that the signals $u_m(k)$ and $\underline{u}_m(k)$ are orthogonal, and $S_m$ is to be selected so that $\overline{u_m^2(k)}$ and $\overline{\hat{u}_m^2(k)}$ are equal. Specifically, this means that $R_m$ must satisfy:

$$u_m(k) \cdot \underline{u}_m(k) = u_m(k) \cdot S_m\{u_m(k-1) + R_m u_m(k)\}$$
$$= 0$$

from which it follows that:

$$R_m = -\overline{u_m(k) \cdot u_m(k-1)} = -\frac{a_m}{1+b_m} \quad (7)$$

$S_m$ must be selected so that $\overline{\hat{u}_m^2(k)}$ is equal to $\overline{u_m^2(k-1)} = \overline{u_m^2(k)}$. Accordingly, $S_m$ must satisfy:

$$\overline{u_m^2(k)} = S_m^2 \cdot \overline{\{u_m(k-1) + R_m \cdot u_m(k)\}^2} = \overline{u_m^2(k)}$$

from which it follows that:

$$S_m = \sqrt{\frac{1}{1-R_m^2}} = (1+b_m)\sqrt{\frac{1}{(b_m+1)^2 - a_m^2}} \quad (8)$$

With the above selections, the inputs to the variable-coefficient scalers in ADF-m and ADF-n (where m≠n) will be mutually orthogonal, the inputs to the pair of variable-coefficient scalers in ADF-m will be mutually orthogonal, and the mean square values of the inputs to all the variable-coefficient scalers will be equal. As a result, the correlation matrix of the variable-coefficient scalers of the adaptive digital filter 9 will be diagonalized, and all of the diagonal elements will be equal. The eigenvalues of this matrix are all the same. Convergence is therefore rapid even when the well-known and easily-implemented gradient method (or method of steepest descent, learning identification method, etc.) is used as the method of adaptive control of the variable coefficients.

Figure 5A:
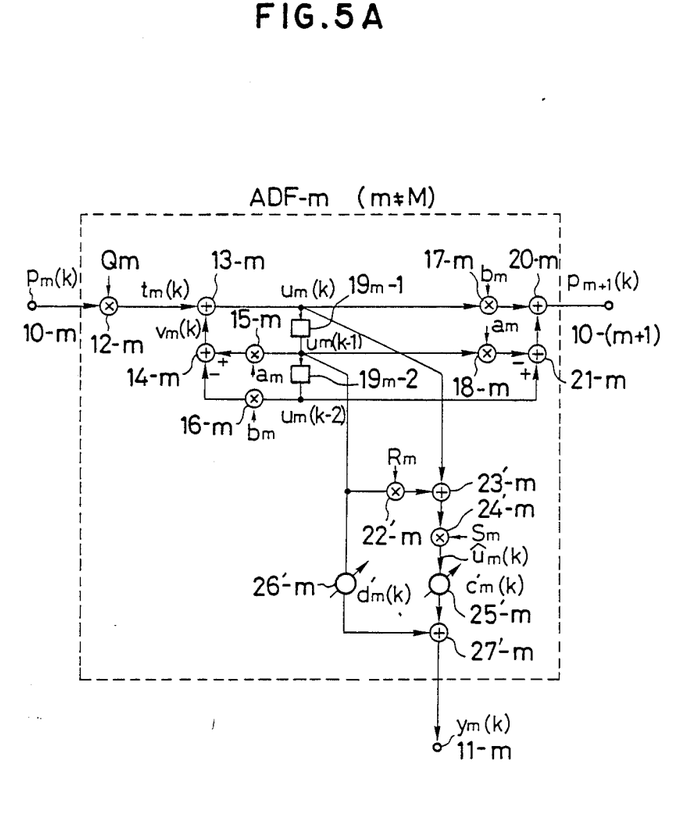
FIG. 5A is a block diagram showing the construction of ADF-m(m=M) of a second embodiment of the invention.
Figure 5B:
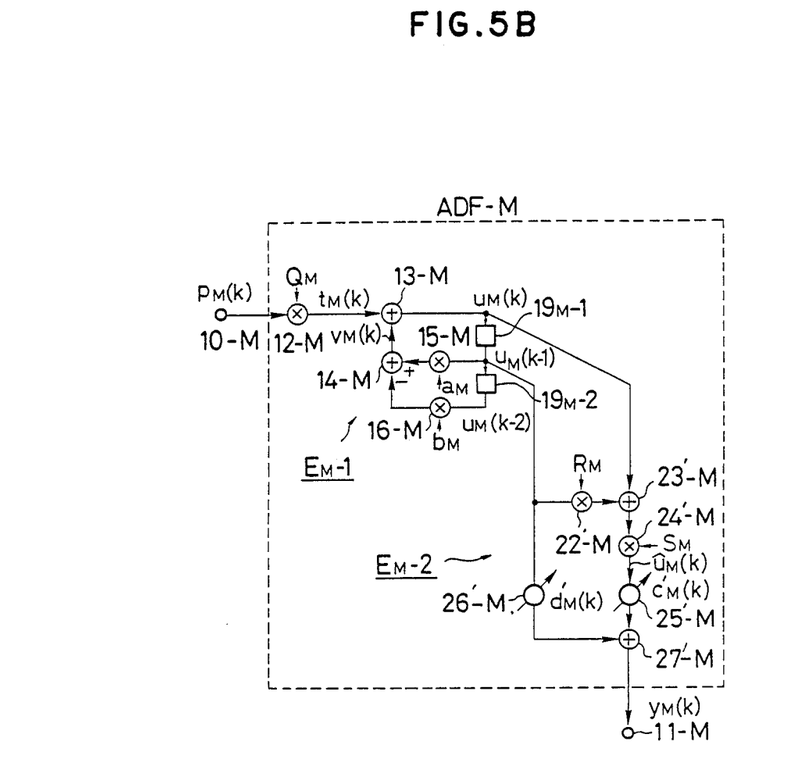
FIG. 5B is a block diagram showing the construction of ADF-M of the second embodiment of the invention.

FIGS. 5A and 5B show a second embodiment of the invention. The general construction of the second embodiment is identical to that of the first embodiment illustrated in FIG. 4A. The construction of ADF-m(m≠M) of the second embodiment is shown in FIG. 5A. The construction of ADF-M of the second embodiment is shown in FIG. 5B.

The ADF-m(m≠M) shown in FIG. 5A differs from the ADF-m(m≠M) shown in FIG. 4B in the following respects:

1. A scaler 22'-m is connected to multiply $u_m(k-1)$.
2. An adder 23'-m is connected to add the output of the scaler 22'-m to $u_m(k)$.
3. A scaler 24'-m is connected to multiply the output of the adder 23'-m by Sm.
4. A variable-coefficient scale 25'-m is connected to multiply the output of the multiplier 24'-m by $c'_m(k)$.
5. A variable-coefficient scaler 26'-m, similar to the variable-coefficient scaler 26-m is connected to multiply $u_m(k-1)$ by $d'_m(k)$.

The ADF-M shown in FIG. 5B has similar modifications with respect to scalers 22'-M, 24'-M, an adder 23'-M, and variable coefficient scalers 25'-M, 26'-M.

The operations of the second embodiment is as follows:

The circuit ADF-m (m≠M) in FIG. 5A operates as follows. At time k the input terminal 10-m receives the signal $p_m(k)$ sent from ADF-(m-1). (The signal $p_1(k)$ received at the input terminal 10-1 of ADF-1 is the signal x(k) fed to the input terminal 1.) The input signal $p_m(k)$ at time k is multiplied by the coefficient $Q_m$ in the scaler 12-m to create the signal $t_m[=Q_m p_m(k)]$. Also at time k, the signal $u_m(k-1)$ is multiplied by $a_m$ in the scaler 15-m to create the signal $a_m u_m(k-1)$, the signal $u_m(k-2)$ is multiplied by $b_m$ in the scaler 16-m to create the signal $b_m u_m(k-2)$, this signal is inverted to create the signal $-b_m u_m(k-2)$, and the result is added to $a_m u_m(k)$ in the adder 14-m to obtain the signal $v_m(k)$. The signals $v_m(k)$ and $t_m(k)$ at time k are added to obtain the signal $u_m(k)$, which is fed to the unit delay element 19m-1 and shifted in the time domain by passage through the unit delay elements 19m-1 and 19m-2. The adder 23'-m adds the signal $u_m(k)$ which is input to the unit delay element 19m-1 at time k and the signal $R_m u_m(k-1)$ obtained by multiplying the signal $u_m(k-1)$ input to the unit delay element 19m-2 at time k by $R_m$; and the scaler 24'-m multiplies the result by $S_m$ to create the signal $\hat{u}_m(k)$. This signal is multiplied by $c'_m(k)$ in the variable-coefficient scaler 25'-m, then added in the adder 27'-m to the product of the signal $u_m(k-1)$ and the variable coefficient $d'_m(k)$ to create the signal $y_m(k)$, which is sent to the output terminal 11-m. Also at time k, the signal $u_m(k-1)$ is multiplied by $a_m$ in the scaler 18-m and the product $a_m u_m(k-1)$ is inverted and added to the signal $u_m(k-2)$ in the adder 21-m. The result is added in the adder 20-m to the product of the signal $u_m(k)$ and $b_m$ generated by the scaler 17-m, and the result $p_{m+1}(k)$ is fed to the input terminal 10-(m+1) of ADF-(m+1).

The circuit ADF-M in FIG. 5B operates as follows. At time k the input terminal 10-M receives the signal $p_M(k)$ sent from ADF-(M-1). The input signal $p_M(k)$ at time k is multiplied by the coefficient $Q_M$ in the scaler 12-M to create the signal $t_M(k)$ $[=Q_M p_M(k)]$. Also at time k, the signal $u_M(k-1)$ is multiplied by $a_M$ in the scaler 15-M to create the signal $a_M u_M(k-1)$, the signal $u_M(k-2)$ is multiplied by $b_M$ in the scaler 16-M to create the signal $b_M u_M(k-2)$, this signal is inverted to create the signal $-b_M u_M(k-2)$, and the result and $a_M u_M(k)$ are added in the adder 14-M to obtain the signal $v_M(k)$. The signals $v_M(k)$ and $t_M(k)$ at time k are added to obtain the signal $u_M(k)$, which is fed to the unit delay element 19M-1 and shifted in the time domain by passage through the unit delay elements 19M-1 and 19M-2. The adder 23'-M adds the signal $u_M(k)$ which is input to the unit delay element 19M-2 at time k and the signal $R_M u_M(k-1)$ obtained by multiplying the signal $u_M(k-1)$ input to the unit delay element 19M-2 at time k by $R_M$, and the scaler 24'-M multiplies the result by $S_M$ to create the signal $\hat{u}_M(k)$. This signal is multiplied by $c'_M(k)$ in the variable-coefficient scaler 25'-M, then added in the adder 27-M to the product of the signal $u_M(k-1)$ and the variable coefficient $d'_M(k)$ generated by the variable-coefficient scaler 26'-M to create the signal $y_M(k)$, which is sent to the output terminal 11-M.

The coefficients $Q_m$, $R_m$ and $S_m$ can be selected in a manner similar to that described in connection with the first embodiment, so as to make the signals input to the variable-coefficient scalers 25'-m and 26'-m mutually orthogonal, and to make their mean square values equal.

Thus similar results are obtained from the constructions of the second embodiment shown in FIGS. 5A and 5B.

As described above, in this invention the inputs to the variable-coefficient scalers of an adaptive digital filter are mutually orthogonal and their mean square values are equal. As a result, the rate of convergence of the variable coefficients of the variable-coefficient scalers is rapid.

This invention is suitable for use in devices such as echo cancelers.

What is claimed is:

1. An adaptive digital filter comprising M basic sections (ADF-1 to ADF-M: where M is a positive integer) connected in series, in which the first M-1 basic sections (ADF-1 to ADF-(M-1)) include an input terminal (10-m), a first output terminal (11-m), and a second output terminal (10-(m+1)), the M-th basic section includes an input terminal (10-M) and a first output terminal (11-M), the input terminal (10-1) of the first basic section (ADF-1) is the signal input terminal of the adaptive digital filter as a whole, the input terminal (10-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11-m) of each of the basic sections, wherein:

(a) in each of the M basic sections (ADF-m), the path from the input terminal (10-m) to the first output terminal (11-m) comprises a first scaler (12-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10-m) to the second output terminal (10-(m+1)) comprises: the above first scaler (12-m), the above second-order recursive digital filter ($E_m$-1), and a second-order nonrecursive digital filter ($E_m$-3), which are connected in series, (c) in the m-th basic section ($1 \leq m \leq M$), the first-order nonrecursive digital filter (Em-2) comprises a second scaler (22-m; 22'-m) for multiplying one of the input signal $u_m(k)$ and a signal $u_m(k-1)$ which is the previous value of $u_m(k)$, by a coefficient $R_m$, a first adder (23-m; 23'-m) for adding the output of the second scaler (22-m; 22'-m) to the other of the signal $u_m(k)$ and the signal $u_m(k-1)$, a third scaler (24-m; 24'-m) for multiplying the output of the first adder (23-m; 23'-m) by a coefficient $S_m$, a variable-coefficient scaler (26-m; 25'-m) for multiplying the output $\hat{u}_m(k)$ of the third scaler (24-m; 24'-m) by a variable coefficient ($d_m(k); c'_m(k)$) to form a first product, a variable-coefficient scaler (25-m; 26'-m) for multiplying the other of the signal $u_m(k)$ and the signal $u_m(k-1)$ by a variable coefficient ($c_m(k); d'_m(k)$) to form a second product, and a second adder (27-m) for adding together the first and second products, (d) the coefficient $Q_m$ of the first scaler (12-m) is selected so that the mean square value of $u_m(k)$ in each basic section is equal to the mean square value of the signals at the corresponding series connection points in the other basic sections, (e) the coefficient $R_m$ of the second scaler (22-m; 22'-m) is selected so that the signals $u_m(k)$ and $\hat{u}_m(k)$ are orthogonal, and (f) the coefficient $S_m$ of the third scaler (24-m; 24'-m) is selected so that the mean square value of the signal $u_m(k)$ and the mean square value of the signal $\hat{u}_m(k)$ are equal.

2. An adaptive digital filter comprising M basic sections (ADF-1 to ADF-M: where M is a positive integer) connected in series, in which the first M-1 basic sections (ADF-1 to ADF-(M-1)) include an input terminal (10-m), a first output terminal (11-m), and a second output terminal (10-(m+1)), the M-th basic section includes an input terminal (10-M) and a first output terminal (11-M), the input terminal (10-1) of the first basic section (ADF-1) is the signal input terminal of the adaptive digital filter as a whole, the input terminal (10-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11-m) of each of the basic sections, wherein:

(a) in each of the M basic sections (ADF-m), the path from the input terminal (10-m) to the first output terminal (11-m) comprises a first scaler (12-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10-m) to the second output terminal (10-(m+1)) comprises: the above first scaler (12-m), the above second-order recursive digital filter ($E_m$-1), and a second-order nonrecursive digital filter ($E_m$-3), which are connected in series, (c) in the m-th basic section ($1 < m < M$), in the first-order nonrecursive digital filter ($E_m$-2) comprises a second scaler (22-m) for multipyling the input signal $u_m(k)$ by a coefficient $R_m$, a first adder (23-m) for adding the output of the second scaler (22-m) to the signal $u_m(k-1)$, a third scaler (24-m) for multiplying the output of the first adder (23-m) by a coefficient $S_m$, a variable-coefficient scaler (26-m) for multiplying the output $\hat{u}_m(k)$ of the third scaler (24-m) by a variable coefficient $d_m(k)$ to form a first product $d_m(k)\hat{u}_m(k)$, a variable-coefficient scaler (25-m) for multiplying the signal $u_m(k)$ by a variable coefficient $c_m(k)$ to form second product $c_m(k)u_m(k)$, and a second adder (27-m) for adding together the first and second products, (d) the coefficient $Q_m$ of the first scaler (12-m) is selected so that the mean square value of $u_m(k)$ in each basic section is equal to the mean square value of the signals at the corresponding series connection points in the other basic sections, (e) the coefficient $R_m$ of the second scaler (22-m) is selected so that the signals $u_m(k)$ and $\hat{u}_m(k)$ are orthogonal, and (f) the coefficient $S_m$ of the third scaler (24-m) is selected so that the mean square value of the signal $u_m(k)$ and the mean square value of the signal $\hat{u}_m(k)$ are equal.

3. An adaptive digital filter comprising M basic sections (ADF-1 to ADF-M: where M is a positive integer) connected in series, in which the first M-1 basic sections (ADF-1 to ADF-(M-1)) include an input terminal (10'-m), a first output terminal (11'-m), and a second output terminal (10-(m+1)), the M-th basic section includes an input terminal (10'-M) and a first output terminal (11'-M), the input terminal (10-1) of the first basic section (ADF-1) is the signal input terminal of the adaptive digital filter as a whole, the input terminal (10'-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11'-m) of each of the basic sections, wherein:

(a) in each of the M basic sections (ADF-m), the path from the input terminal (10'-m) to the first output terminal (11'-m) comprises a first scaler (12'-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10'-m) to the second output terminal (10-(m+1)) comprises: the above first scaler (12'-m), the above second-order recursive digital filter ($E_m$-1), and a second-order nonrecursive digital filter ($E_m$-3), which are connected in series, (c) the m-th basic section ($1 < m < M$), the first-order nonrecursive digital filter ($E_m$-2) comprises a second scaler for multiplying the signal $u_m(k-1)$ by a coefficient $R_m$, a first adder for adding the output of the second scaler to the input signal $u_m(k)$, a third scaler for multiplying the output of the first adder by a coefficient $S_m$, a variable-coefficient scaler for multiplying the output $\hat{u}_m(k)$ of the third scaler by a variable coefficient $C'_m(k)$ to form a first product $c'_m(k)u_m(k)$, a variable-coefficient scaler for multiplying the signal $u_m(k-1)$ by a variable coefficient $d'_m(k)$ to form a second product $d'_m(k)u_m(k-1)$, and a second adder for adding together the first and second products, (d) the coefficient $Q_m$ of the first scaler (12'-m) is selected so that the mean square value of $u_m(k)$ in each basic section is equal to the mean square value of the signals at the corresponding series connection points in the other basic sections, (e) the coefficient $R_m$ of the second scaler (22'-m) is selected so that the signals $u_m(k)$ and $u_m(k)$ are orthogonal, and (f) the coefficient $S_m$ of the third scaler (24'-m) is selected so that the mean square value of the signal $u_m(k)$ and the mean square value of the signal $u_m(k)$ are equal.

4. An adaptive digital filter comprising M basic sections (ADF-1 to ADF-M: where M is a positive integer) connected in series, in which the first M-1 basic sections (ADF-1 to ADF-(M-1)) include an input terminal (10-m), a first output terminal (11-m), and a second output terminal (10-(m+1)), the M-th basic section includes an input terminal (10-M) and a first output terminal (11-M), the input terminal (10-1) of the first basic section (ADF-1) is the signal input terminal of the adaptive digital filter as a whole, the input terminal (10-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11-m) of each of the basic sections, wherein:

(a) in each of the M basic sections (ADF-m), the path from the input terminal (10-m) to the first output terminal (11-m) comprises a first scaler (12-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10-m) to the second output terminal (10-(m+1)) comprises: the above first scaler (12-m), the above second-order recursive digital filter ($E_m$-1), and a second-order nonrecursive digital filter ($E_m$-3), which are connected in series, (c) in the m-th basic section ($1 \leq m \leq M$), the first-order nonrecursive digital filter (Em-2) comprises a second scaler (22-m) for multiplying one of the input signal $u_m(k)$ and a signal $u_m(k-1)$ which is the previous value of $u_m(k)$, by a coefficient $R_m$, a first adder (23-m) for adding the output of the second scaler (22-m) to the other of the signal $u_m(k)$ and the signal $u_m(k-1)$, a third scaler (24-m) for multiplying the output of the first adder (23-m) by a coefficient $S_m$, a variable-coefficient scaler (26-m) for multiplying the output $\hat{u}_m(k)$ of the third scaler (24-m) by a variable coefficient ($d_m(k);c'_m(k)$) to form a first product, a variable-coefficient scaler (25-m) for multiplying the other of the signal $u_m(k)$ and the signal $u_m(k-1)$ by a variable coefficient ($c_m(k);d'_m(k)$) to form a second product, and a second adder (27-m) for adding together the first and second products, (d) in the m-th basic section ($1 \leq m \leq M$), the second order recursive digital filter ($E_m$-2) for an input signal $t_m(k)$ which is output by the first scaler (12-m) provides an output $u_m(k)=t_m(k)+a_m u_m(k-1)+b_m u_m(k-2)$, and the second order nonrecursive filter ($E_m$-2) provides an output $p_{m+1}(k)=b_m u_m(k)+a_m u_m(k-1)+u_m(k-2)$, where $a_m$ and $b_m$ are predetermined coefficients;

(e) the coefficient $Q_m$ of the first scaler (12-m) is selected so that:

$$Q_1 = \sqrt{\frac{(1-b_1)\{(b_1+1)^2 - a_1^2\}}{1+b_1}} \text{ and}$$

$$Q_m = \sqrt{\frac{(1-b_m)\{(b_m+1)^2 - a_m^2\}}{1+b_m}} \cdot \frac{1}{Q_{m-1}},$$

(f) the coefficient $R_m$ of the second scaler (22-m) is selected so that $R_m = -a_m/(1+b_m)$, and (g) the coefficient $S_m$ of the third scaler (24-m) is selected so that $S_m =$ $$\sqrt{(1/(1-R_m^2))}.$$

5. An adaptive digital filter comprising M basic sections (ADF-1 to ADF-M: where M is a positive integer) connected in series, in which the first M-1 basic sections (ADF-1 to ADF-(M-1)) include an input terminal (10-m), a first output terminal (11-m), and a second output terminal (10-(m+1)), the M-th basic section includes an input terminal (10-M) and a first output terminal (11-M), the input terminal (10-1) of the first basic section (ADF-1) is the signal input terminal of the adaptive digital filter as a whole, the input terminal (10-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11-m) of each of the basic sections, wherein:

(a) in each of the M basic sections (ADF-m), the path from the input terminal (10-m) to the first output terminal (11-m) comprises a first scaler (12-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10-m) to the second output terminal (10-(m+1)) comprises: the above first scaler (12-m), the above second-order recursive digital filter ($E_m$-1), and a second-order nonrecursive digital filter ($E_m$-3), which are connected in series, (c) in the m-th basic section ($1<m<M$), in the first-order nonrecursive digital filter ($E_m$-2) comprises a second scaler (22-m) for multipyling the input signal $u_m(k)$ by a coefficient $R_m$, a first adder (23-m) for adding the output of the second scaler (22-m) to the signal $u_m(k-1)$ a third scaler (24-m) for multiplying the output of the first adder (23-m) by a coefficient $S_m$, a variable-coefficient scaler (26-m) for multiplying the output $u_m(k)$ of the third scaler (24-m) by a variable coefficient $d_m(k)$ to form a first product $d_m(k)u_m(k)$, a variable-coefficient scaler (25-m) for multiplying the signal $u_m(k)$ by a variable coefficient $c_m(k)$ to form second product $c_m(k)u_m(k)$, and a second adder (27-m) for adding together the first and second products, (d) in the m-th basic section ($1 \leq m \leq M$), the second order recursive digital filter ($E_m$-2) for an input signal $t_m(k)$ which is output by the first scaler (12-m) provides an output $u_m(k)=t_m(k)+a_m u_m(k-1)+b_m u_m(k-2)$, and the second order nonrecursive filter ($E_m$-2) provides an output $p_{m+1}(k)=b_m u_m(k)+a_m u_m(k-1)+u_m(k-2)$, where $a_m$ and $b_m$ are predetermined coefficients;

(e) the coefficient $Q_m$ of the first scaler (12-m) is selected so that:

$$Q_1 = \sqrt{\frac{(1-b_1)\{(b_1+1)^2 - a_1^2\}}{1+b_1}} \text{ and}$$

$$Q_m = \sqrt{\frac{(1-b_m)\{(b_m+1)^2 - a_m^2\}}{1+b_m}} \cdot \frac{1}{Q_{m-1}},$$

(f) the coefficient $R_m$ of the second scaler (22-m) is selected so that $R_m = -a_m/(1+b_m)$, and (h) the coefficient $S_m$ of the third scaler (24-m) is selected so that $S_m =$ $$\sqrt{(1/(1-R_m^2))}.$$

6. An adaptive digital filter comprising M basic sections (ADF-1 to ADF-M: where M is a positive integer) connected in series, in which the first M-1 basic sections (ADF-1 to ADF-(M-1)) include an input terminal (10-m), a first output terminal (11-m), and a second output terminal (10-(m+1)), the M-th basic section includes an input terminal (10-M) and a first output terminal (11-M), the input terminal (10-1) of the first basic section (ADF-1) is the signal input terminal of the adaptive digital filter as a whole, the input terminal (10-m) of each of the other basic sections (ADF-2 to ADF-M) is connected to the second output terminal of the immediately preceding basic section (ADF-(m-1)), and the output of the adaptive digital filter as a whole is the sum of the signals output from the first output terminals (11-m) of each of the basic sections, wherein:

(a) in each of the M basic sections (ADF-m), the path from the input terminal (10-m) to the first output terminal (11-m) comprises a first scaler (12-m) for multiplying a signal input thereto by a coefficient $Q_m$, a second-order recursive digital filter ($E_m$-1), and a first-order nonrecursive digital filter ($E_m$-2), which are connected in series, and the input of the first-order nonrecursive digital filter ($E_m$-2) is connected to a zero delay output node of the second-order recursive digital filter ($E_m$-1), (b) in each of the first through the M-1-th basic sections (ADF-m), the path from the input terminal (10-m) to the second output terminal (10-(m+1)) comprises: the above first scaler (12-m), the above second-order recursive digital filter ($E_m$-1), and a second-order nonrecursive digital filter ($E_m$-3), which are connected in series, (c) the m-th basic section ($1<m<M$), the first-order nonrecursive digital filter ($E_m$-2) comprises a second scaler for multiplying the signal $u_m(k-1)$ by a coefficient $R_m$, a first adder for adding the output of the second scaler to the input signal $u_m(k)$, a third scaler for multiplying the output of the first adder by a coefficient $S_m$, a variable-coefficient scaler for multiplying the output $\hat{u}_m(k)$ of the third scaler by a variable coefficient $C'_m(k)$ to form a first product $c'_m(k)u_m(k)$, a variable-coefficient scaler (26'-m) for multiplying the signal $u_m(k-1)$ by a variable coefficient $d'_m(k)$ to form a second product $d'_m(k)u_m(k-1)$, and a second adder for adding together the first and second products.

(d) in the m-th basic section ($1<m<M$), the second order recursive digital filter ($E_m$-2) for an input signal $t_m(k)$ which is output by the first scaler (12-m) provides an output $u_m(k)=t_m(k)+a_m u_m(k-1)+b_m u_m(k-2)$, and the second order nonrecursive filter ($E_m$-2) provides an output $p_{m+1}(k)=b_m u_m(k)+a_m u_m(k-1)+u_m(k-2)$,
where $a_m$ and $b_m$ are predetermined coefficients;

(e) the coefficient $Q_m$ of the first scaler (12-m) is selected so that:

$$Q_1 = \sqrt{\frac{(1-b_1)\{(b_1+1)^2 - a_1^2\}}{1+b_1}} \text{ and}$$

$$Q_m = \sqrt{\frac{(1-b_m)\{(b_m+1)^2 - a_m^2\}}{1+b_m}} \cdot \frac{1}{Q_{m-1}},$$

(f) the coefficient $R_m$ of the second scaler (22-m) is selected so that $R_m = -a_m/(1+b_m)$, and (h) the coefficient $S_m$ of the third scaler (24-m) is selected so that $S_m =$ $$\sqrt{(1/(1-R_m^2))} \, .$$

* * * * *